United States Patent
Andreoni et al.

(10) Patent No.: US 7,057,244 B2
(45) Date of Patent: Jun. 6, 2006

(54) DIELECTRIC MATERIALS

(75) Inventors: Wanda Andreoni, Adliswil (CH); Alessandro Curioni, Gattikon (CH); Stephen A. Shevlin, Knoxville, TN (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 10/624,021

(22) Filed: Jul. 21, 2003

(65) Prior Publication Data

US 2004/0077177 A1    Apr. 22, 2004

(30) Foreign Application Priority Data

Jul. 19, 2002  (EP) .................................. 02016100

(51) Int. Cl.
*H01L 29/76* (2006.01)

(52) U.S. Cl. ...................... 257/410; 438/287
(58) Field of Classification Search ................ 257/410, 257/411; 438/287
See application file for complete search history.

(56) References Cited

U.S. PATENT DOCUMENTS

2002/0195565 A1* 12/2002 Lecoq ................... 250/363.03

FOREIGN PATENT DOCUMENTS

| JP | 2000-256098 | 9/2000 |
|---|---|---|
| JP | 2001-110801 | 4/2001 |
| JP | 2001-250923 | 9/2001 |
| JP | 2002-280461 | 9/2002 |
| JP | 2003-017689 | 1/2003 |
| JP | 2003-218104 | 7/2003 |

* cited by examiner

*Primary Examiner*—Edward Wojciechowicz
(74) *Attorney, Agent, or Firm*—Scully, Scott, Murphy & Presser, P.C.; Robert M. Trepp

(57) ABSTRACT

An article of manufacture comprises a substrate and a layer of $N_{(x)}Y_{(1-x)}AlO_3$ on the substrate where x is a molar fraction greater than zero and less than one, and N is an element selected from La, Ce, Pr, Nd, Pm, Sm, Eu, Gd, Tb, Dy, Ho, Er, Tm, Yb, and Lu. The article may be an electronic device further comprising an electrode electrically isolated from the substrate by the layer. In particular, the dielectric properties of the layer are such that the layer is especially although by no means exclusively useful for electrically isolating gate electrodes in field effect transistor devices. The layer may be formed on the substrate via molecular beam epitaxy.

15 Claims, 5 Drawing Sheets

DIELECTRIC MATERIALS

FIELD OF THE INVENTION

The present invention generally relates to dielectric materials and particularly relates to dielectric materials for semiconductor switch devices.

BACKGROUND OF THE INVENTION

Conventional semiconductor switch devices for very large scale integration (VLSI) applications include complementary metal oxide semiconductor (CMOS) switches. A CMOS switch typically comprises a field effect transistor having a conduction channel extending in a silicon substrate between a source electrode and a drain electrode. A gate electrode is disposed on the substrate between the source and drain. Conventionally, the gate electrode is insulated from the channel by a gate dielectric layer of silicon dioxide. In operation, the flow of current through the channel between the source and drain is controlled by application of voltage to the gate.

To date, the performance of microprocessors based on CMOS technology has increased with time in a substantially exponential fashion. This continuing increase in microprocessor performance has been at least partially facilitated by continuing reductions in CMOS device feature size. The thickness of the gate dielectric is reduced in correspondence to reduction in feature size. However, as the feature size is reduced beyond 0.1 micro-meter, the thickness of the gate dielectric becomes so small that electrical breakdown occurs between the gate and channel where silicon dioxide is employed the gate dielectric material. Upon breakdown, the gate dielectric layer becomes electrically conductive. Clearly, this effect is undesirable, and places a lower limit on the degree to which CMOS devices can be scaled with silicon dioxide as the gate dielectric material. Accordingly, it would be desirable to provide a dielectric alternative to silicon dioxide that permits continuing reduction in device feature size and thus a continuing increase in microprocessor performance. Silicon dioxide has a static dielectric constant (K) of around 4.0. It would be desirable to provide a gate dielectric material having a K value substantially higher than that of silicon dioxide. Such a material would permit thinner gate dielectric layers than presently possible with silicon dioxide while preserving current CMOS semiconductor technology. Gate dielectric layers of a thickness in the region of 2 nm or less would be preferable.

$Al_2O_3$ is one material that has been investigated as an alternative gate dielectric material for replacing silicon dioxide. The K value associated with $Al_2O_3$ is about 10. However, a problem associated with $Al_2O_3$ is that it introduces a significant decrease in charge carrier mobility with respect to silicon dioxide. Another problem associated with $Al_2O_3$ as a gate dielectric material is that it is susceptible to boron diffusion. Boron is regularly employed as a dopant in CMOS devices for producing Ohmic contacts and the like. Diffusion of boron into the gate dielectric layer produces an unwanted degradation of the dielectric properties of the gate dielectric layer. In addition, a layer of silicon dioxide typically forms at the interface between the $Al_2O_3$ and the silicon. This silicon dioxide layer further reduces the effective K value. These problems have generally discouraged further efforts into investigating $Al_2O_3$ as a replacement for silicon dioxide as a gate dielectric materials for CMOS devices.

SUMMARY OF THE INVENTION

In accordance with the present invention, there is now provided an article of manufacture comprising a substrate and a layer of $N_{(x)}Y_{(1-x)}AlO_3$ on the substrate where x is a molar fraction greater than zero and less than one, and N is an element selected from La, Ce, Pr, Nd, Pm, Sm, Eu, Gd, Tb, Dy, Ho, Er, Tm, Yb, and Lu. In preferred embodiments of the present invention, N is La. The layer preferably has a rhombohedral perovskite structure. In particularly preferred embodiments of the present invention, the layer has an average dielectric constant value between 15 and 35. The molar fraction x is preferably greater than 0.07. However, in particularly preferred embodiments of the present invention, x is less than 0.4. In some applications of the present invention, an electrode may be electrically isolated from the substrate by the layer. Examples of such applications include electronic devices such as field effect transistors in which the layer is especially suited to isolating the gate electrode from conduction channel. The layer may be formed on the substrate via molecular beam epitaxy.

In a preferred embodiment of the present invention, there is provided a gate dielectric material comprising an alloy of LaAl and YAl Oxides. Rhombohedral forms of this alloy advantageously have an average K value of around 25 to 30. Also, such forms of this alloy have a relatively high spatial anisotropy. The relatively high spatial anisotropy leads to a very high K value of around 50 in a direction extending perpendicular to the channel. This direction will hereinafter be referred to as the "Z direction". In addition, the alloy provides sufficiently hard phonons in a plane perpendicular to the Z direction. Such phonons prevent mobility decreases due to phonon scattering. Furthermore, the alloy exhibits improved thermodynamic stability and good interfacial properties with silicon.

BRIEF DESCRIPTION OF THE DRAWINGS

Preferred embodiments of the present invention will now be described, by way of example only, with reference to the accompanying drawings, in which.

DESCRIPTION OF THE PREFERRED EMBODIMENT

Experiments indicate that a stoichiometric alloy of $Al_2O_3$ and $Y_2O_3$ produces a crystalline solid solution $YAlO_3$ (YAP) with an orthorhombic perovskite structure and a K value of around 15. $YAlO_3$ is probably isotropic. In addition, $Y_2O_3$/Si(1 0 0) interfaces have good electrical properties. By contrast, a stoichiometric alloy of $Al_2O_3$ and $La_2O_3$ produces a crystalline solid solution $LaAlO_3$ (LAR) with a rhombohedral perovskite structure and a K value of around 26. $LaAlO_3$ is probably highly anisotropic. However, $La_2O_3/Si(1\ 0\ 0)$ interfaces do not have good electrical properties. Despite this, we have found that alloys of $YAlO_3$ and $LaAlO_3$ have surprisingly desirable dielectric qualities. These qualities will now be described in detail.

Figure 1:
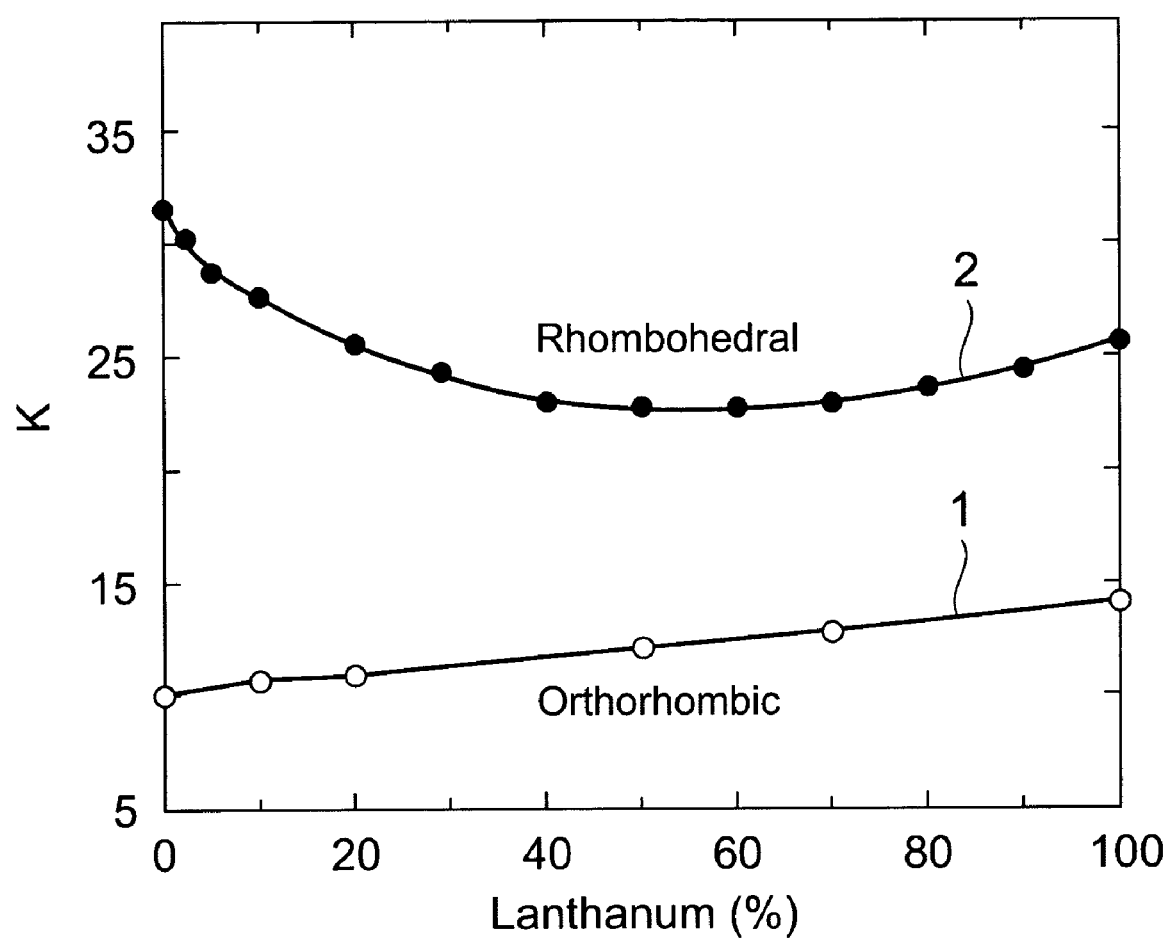
FIG. 1 is a graph of theoretical average K value against percentage molar fraction of lanthanum for orthorhombic and rhombohedral perovskite structures of $La_{(x)}Y_{(1-x)}AlO_3$.

Referring to FIG. 1, curve 1 demonstrates the theoretical average K value of $La_{(x)}Y_{(1-x)}AlO_3$ in orthorhombic perovskite structure as a function of La concentration. Curve 2 demonstrates the theoretical K value of $La_{(x)}Y_{(1-x)AlO3}$ in rhombohedral perovskite structure as a function of La concentration. Curves 1 and 2 demonstrate that the K value of the rhombohedral structure is much greater than that of the orthorhombic structure throughout the composition range.

Figure 2:
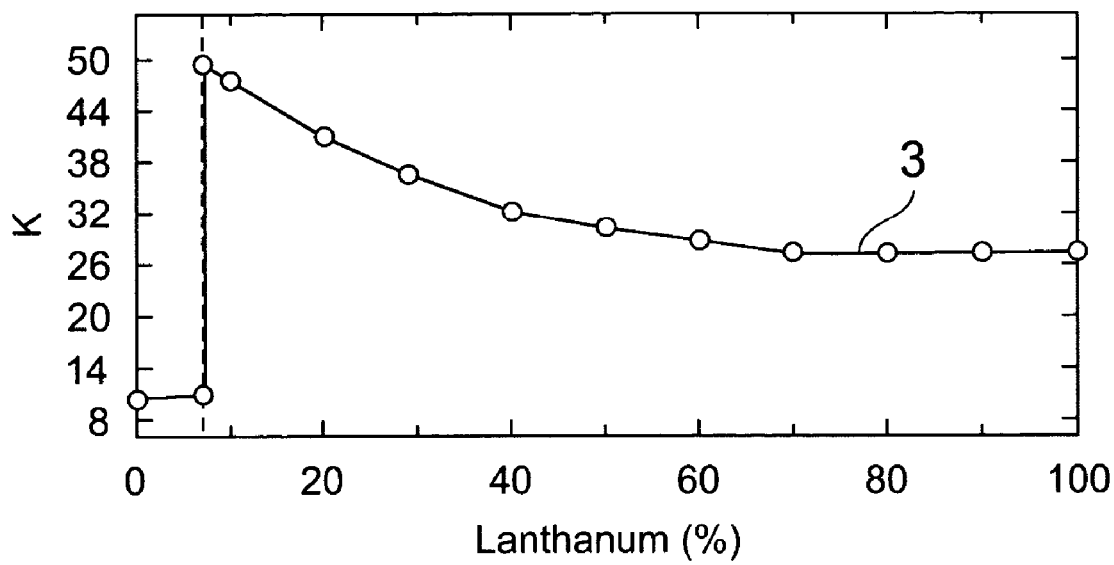
FIG. 2 is a graph of actual K value in the Z direction against percentage molar fraction of lanthanum for perovskite structures of $La_{(x)}Y_{(1-x)}AlO_3$.

Turning to FIG. 2, curve 3 demonstrates variation the actual K value in the Z direction of $La_{(x)}Y_{(1-x)}AlO_3$ perovskite structures as a function of La concentration. Below a relatively low concentration of La, around 7%, the rhombohedral structure of $La_{(x)}Y_{(1-x)}AlO_3$ is unstable. Accordingly, below around 7% La concentration, $La_{(x)}Y_{(1-x)}AlO_3$ assumes the orthorhombic structure. As demonstrated by curve 3, $La_{(x)}Y_{(1-x)}AlO_3$ in orthorhombic form exhibits a relatively low K value in the Z direction. However, at around 7% La concentration, the rhombohedral form of $La_{(x)}Y_{(1-x)}AlO_3$ stabilizes. As demonstrated by curve 3, $La_{(x)}Y_{(1-x)}AlO_3$ in rhombohedral form exhibits a significantly higher K value in the Z direction. Accordingly, there is a significant step in curve 3 corresponding to the transition between the orthorhombic and rhombohedral phases of $La_{(x)}Y_{(1-x)}AlO_3$ at around 7% La concentration. Curve 3 demonstrates that Yttrium rich rhombohedral perovskites exhibit highly anisotropic dielectric properties in the Z direction.

Figure 3:
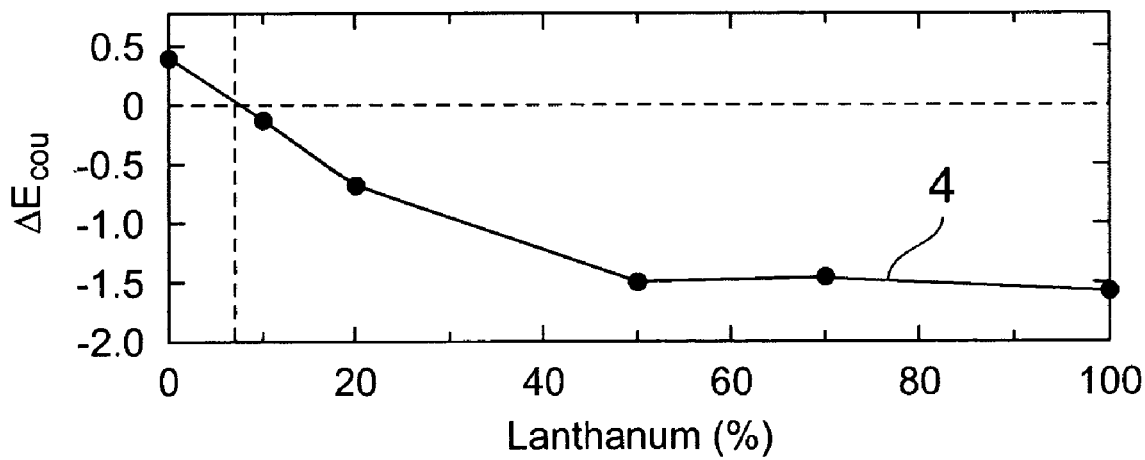
FIG. 3 is a graph of differential cohesion energy against percentage molar fraction of lanthanum for perovskite structures of $La_{(x)}Y_{(1-x)}AlO_3$.
Figure 4:
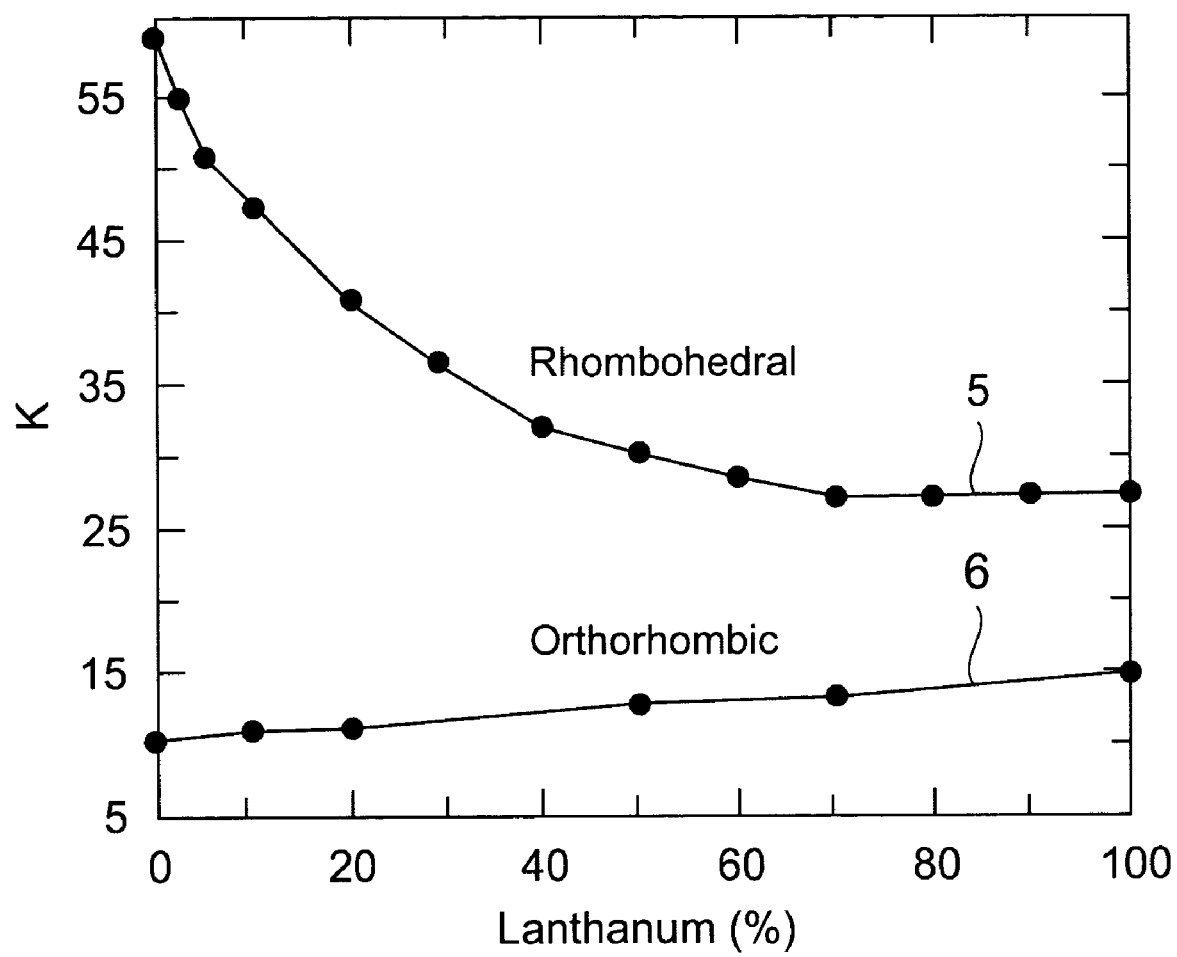
FIG. 4 is a graph of theoretical K value in the Z direction against percentage molar fraction of lanthanum for orthorhombic and rhombohedral perovskite structures of $La_{(x)}Y_{(1-x)}AlO_3$.

A further understanding of the aforementioned transition between rhombohedral and orthorhombic phases can be obtained from FIG. 3, in which curve 4 demonstrate the difference in cohesive energy $\Delta E_{coh}$ between the rhombohedral and orthorhombic phases of $La_{(x)}Y_{(1-x)}AlO_3$ as a function of La concentration. At relatively low La concentrations, less than around 7% La, $\Delta E_{coh}$ is positive, corresponding to stability in the orthorhombic structure. However, higher La concentrations, beyond around 7% La, $\Delta E_{coh}$ is negative, corresponding to stability in the rhombohedral structure. The zero crossing point of curve 4 corresponds to a K value of around 50 in the Z direction. A further demonstration of the surprisingly high dielectric properties of Y rich rhombohedral $La_{(x)}Y_{(1-x)}AlO_3$ in the Z direction is provided in FIG. 4 in which curve 5 corresponds to rhombohedral $La_{(x)}Y_{(1-x)}AlO_3$ and curve 6 corresponds to orthorhombic $La_{(x)}Y_{(1-x)}AlO_3$.

Quaternary $La_{(x)}Y_{(1-x)}AlO_3$ alloys with Y concentrations in the range 70 to 90% and La concentrations correspondingly in the range 30 to 10% have particularly preferred characteristics relative to other dielectric oxides investigated to date. Polycrystalline formations of $La_{(x)}Y_{(1-x)}AlO_3$ exhibit surprisingly high dielectric constants, thermodynamic stability, and good electric properties at the interface with silicon. In the interests of optimizing dielectric performance, $La_{(x)}Y_{(1-x)}AlO_3$ is preferably grown epitaxially.

Molecular Beam Epitaxy is one particularly preferred growth technique. However, it will be appreciated that other growth techniques may be employed. Epitaxial growth is preferred because the polycrystalline structure thus produced limits soft-phonons to the direction of epitaxial growth. Without such limitation, dielectric screening and phonon scattering of in plane electrons degrade performance. However, it will be appreciated that the present invention extends to amorphous formations of $La_{(x)}Y_{(1-x)}AlO_3$.

Figure 5:
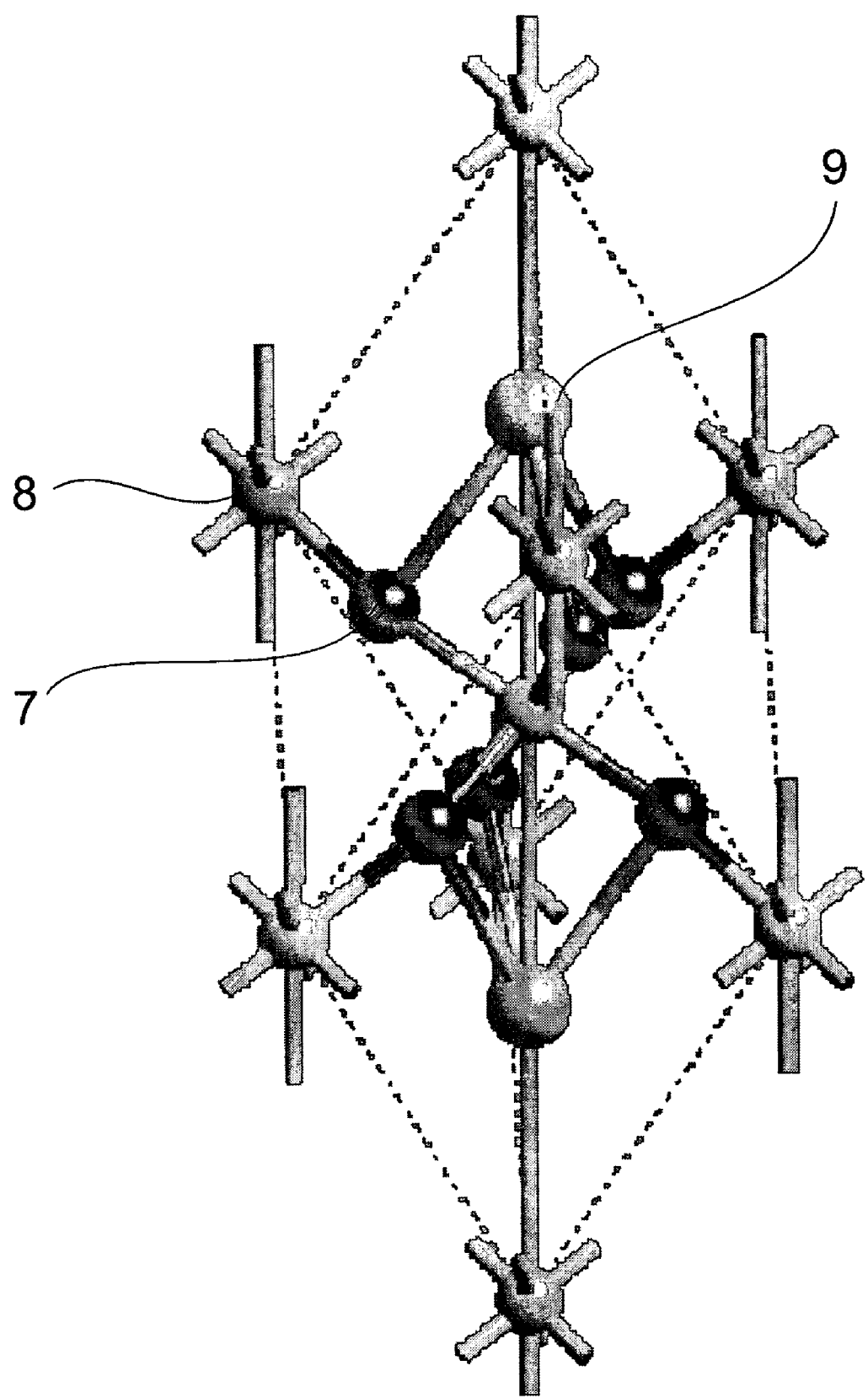
FIG. 5 is an isometric view of the atomic structure of rhombohedral $La_{0.1}Y_{0.9}AlO_3$.

Referring to FIG. 5, depicted therein is the atomic structure of $La_{(x)}Y_{(1-x)}AlO_3$. Atomic sites 7 denote positions occupied by oxygen atoms. Atomic sites 8 denote positions occupied by aluminum atoms. Atomic sites 9 denote positions occupied by either Yttrium atoms with a probability of 90% or lanthanum atoms with probability of 10%.

Figure 6:
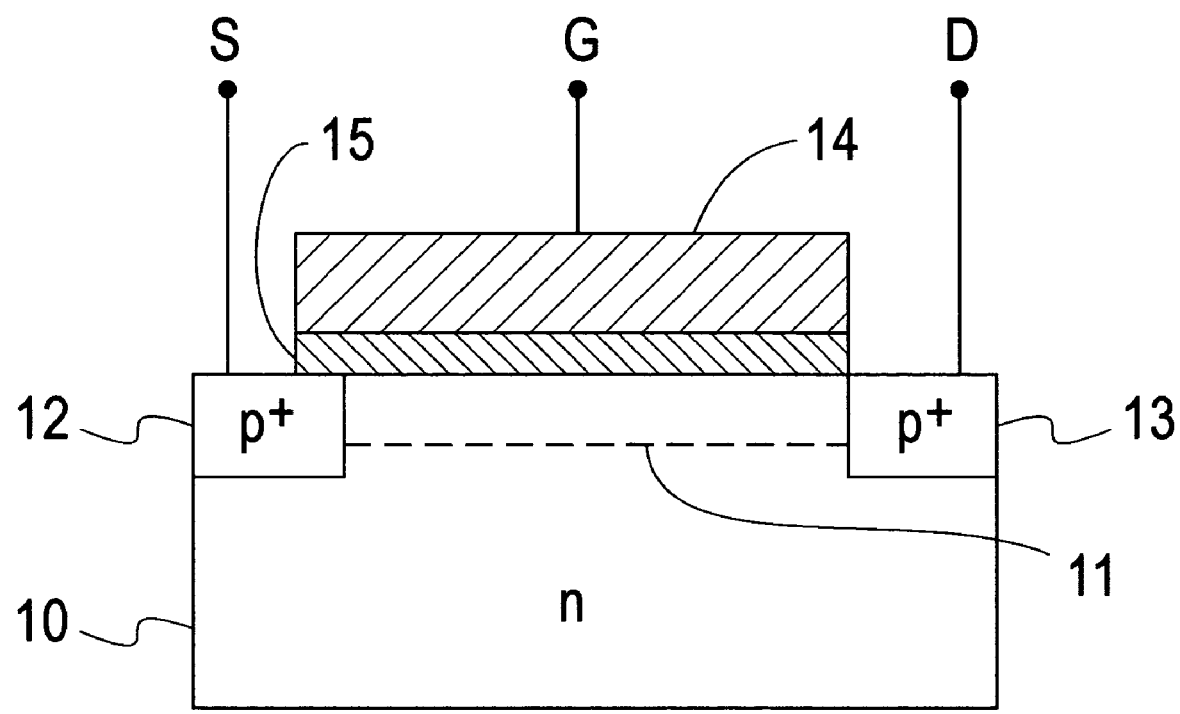
FIG. 6 is cross sectional view of a CMOS field effect transistor.

With reference now to FIG. 6, an example of a CMOS field effect transistor (FET) embodying the present invention comprises a silicon substrate 10. A conduction channel 11 extends through substrate 10 between a source (S) electrode 12 and a drain (D) electrode 13. A gate (G) electrode 14 is disposed on the substrate 10 between the source electrode 12 and the drain electrode 13. In particularly preferred embodiments of the present invention, the source electrode 12 and the drain electrode 13 comprise ohmic contacts. The gate electrode 14 is electrically insulated from the channel 11 by a gate dielectric layer 15. The gate dielectric layer 15 is formed from a rhombohedral perovskite structure of $La_{(x)}Y_{(1-x)}AlO_3$, where x is a molar fraction, preferably with a La concentration close to 10%. In operation, the flow of current through the channel 11 between the source electrode 12 and the drain electrode 13 is controlled by application of voltage to the gate electrode 14. It will be appreciated that the present invention is applicable to both n channel and p channel FET devices.

Preferred embodiments of the present invention have been hereinbefore described with reference to $La_{(x)}Y_{(1-x)}AlO_3$ as a dielectric material. However, the present invention is not limited to the inclusion of La in $La_{(x)}Y_{(1-x)}AlO_3$. The present invention equally contemplates replacing La in $La_{(x)}Y_{(1-x)}AlO_3$ with another element of the lanthanide series. Accordingly, in other embodiments of the present invention, any of Ce, Pr, Nd, Pm, Sm, Eu, Gd, Tb, Dy, Ho, Er, Tm, Yb, and Lu may be substituted for La in $La_{(x)}Y_{(1-x)}AlO_3$.

In addition, although preferred embodiments of the present invention have been hereinbefore described with respect to a field effect transistor device, it will be appreciated that the present invention is equally applicable to other articles of manufacture in which a dielectric material is disposed on a substrate. Such articles include for example electrical charge storing devices such a capacitors. Many other applications are possible.

In summary, described herein by way of example of the present invention is an article of manufacture comprising a substrate and a layer of $N_{(x)}Y_{(1-x)}AlO_3$ on the substrate where x is a molar fraction greater than zero and less than one, and N is an element selected from La, Ce, Pr, Nd, Pm, Sm, Eu, Gd, Tb, Dy, Ho, Er, Tm, Yb, and Lu. The article may be an electronic device further comprising an electrode electrically isolated from the substrate by the layer. In particular, the dielectric properties of the layer are such that the layer is especially although by no means exclusively useful for electrically isolating gate electrodes in field effect transistor devices. The layer may be formed on the substrate via molecular beam epitaxy.

The invention claimed is:

1. Article of manufacture comprising a substrate and a layer of $N_{(x)}Y_{(1-x)}AlO_3$ on the substrate where x is a molar fraction greater than zero and less than one, and N is an element selected from the group consisting of La, Ce, Pr, Nd, Pm, Sm, Eu, Gd, Tb, Dy, Ho, Er, Tm, Yb, and Lu; and said layer has a rhombohedral perovskite structure.

2. Article as claimed in claim 1, wherein N comprises La.

3. Article as claimed in claim 1, wherein said layer has an average dielectric constant value in the range between 15 and 35.

4. Article as claimed in claim 2, wherein x is greater than 0.07.

5. Article as claimed in claim 4, wherein x is less than 0.4.

6. Article as claimed in claim 1, further comprising an electrode electrically isolated from said substrate by said layer.

7. Electronic device comprising an article as claimed in claim 6.

8. Field effect transistor device comprising an article as claimed in claim 6, wherein said electrode is the gate of a field effect transistor device.

9. Method of manufacturing an article of manufacture comprising the steps of selecting a substrate and forming a layer of $N_{(x)}Y_{(1-x)}AlO_3$ on said substrate where x is a molar fraction greater than zero and less than one, and N is an element selected from the group consisting of La, Ce, Pr, Nd, Pm, Sm, Eu, Gd, Tb, Dy, Ho, Er, Tm, Yb, and Lu; and said layer has a rhombohedral perovskite structure.

10. Method of claim 9, wherein said step of forming includes the step of forming said layer by molecular beam epitaxy.

11. Article of manufacture comprising a substrate and a layer of $La_{(x)}Y_{(1-x)}AlO_3$ on the substrate where x is a molar fraction greater than zero and less than one.

12. Article as claimed in claim 11, wherein said layer has a rhombohedral perovskite structure.

13. Article as claimed in claim 11, wherein said layer has an average dielectric constant value in the range between 15 and 35.

14. Article as claimed in claim 11, wherein x is greater than 0.07.

15. Article as claimed in claim 11, wherein x is less than 0.4.

* * * * *

UNITED STATES PATENT AND TRADEMARK OFFICE
CERTIFICATE OF CORRECTION

PATENT NO. : 7,057,244 B2  Page 1 of 1
APPLICATION NO. : 10/624021
DATED : June 06, 2006
INVENTOR(S) : Wanda Andreoni et al.

It is certified that error appears in the above-identified patent and that said Letters Patent is hereby corrected as shown below:

Column 4, Line 5:
"$La_{(x)}Y_{(1-x)}AlO_3$." should read -- $La_{0.1}Y_{0.9}AlO_3$. --

Signed and Sealed this

Twenty-first Day of November, 2006

JON W. DUDAS
*Director of the United States Patent and Trademark Office*